United States Patent [19]

Knauer

[11] Patent Number: 4,737,637

[45] Date of Patent: Apr. 12, 1988

[54] MASS SEPARATOR FOR IONIZED CLUSTER BEAM

[75] Inventor: Wolfgang Knauer, Malibu, Calif.

[73] Assignee: Hughes Aircraft Company, Los Angeles, Calif.

[21] Appl. No.: 920,020

[22] Filed: Oct. 15, 1986

[51] Int. Cl.$^4$ .............................................. H01J 49/48
[52] U.S. Cl. ...................................... 250/281; 250/282
[58] Field of Search .................... 250/281, 282, 305; 204/192.11, 192.31

[56] References Cited

U.S. PATENT DOCUMENTS

| | | | |
|---|---|---|---|
| 3,679,896 | 7/1972 | Wardly | 250/294 |
| 3,774,028 | 11/1973 | Daly | 250/294 |
| 4,120,700 | 10/1978 | Morimoto | 148/175 |
| 4,152,478 | 5/1979 | Takagi | 219/50 |
| 4,554,455 | 11/1985 | Todokoro et al. | 250/305 |
| 4,687,939 | 8/1987 | Miyauchi et al. | 250/492.2 |

Primary Examiner—Carolyn E. Fields
Assistant Examiner—John A. Miller
Attorney, Agent, or Firm—W. Denson-Low; A. W. Karambelas

[57] ABSTRACT

An apparatus for producing a beam of ionized clusters, having a cluster source and an ionizer, includes an electrostatic mass separator which permits only those clusters having a mass greater than a selected value to pass. Unclustered ions and clusters of smaller size are reflected and do not reach the substrate target. The mass separator has a retarding field electrode and an entrance electrode, both in the form of grids with the grid openings aligned. Use of a second electrostatic mass separator allows selection of a narrow range of cluster masses for acceleration against the substrate.

19 Claims, 2 Drawing Sheets 4,737,637

MASS SEPARATOR FOR IONIZED CLUSTER BEAM

The United States Government has rights in this invention pursuant to contract N00014-85-C-0523.

BACKGROUND OF THE INVENTION

This invention relates to the deposition of thin films, and, more particularly, to deposition processes that use ionized clusters.

The deposition of thin films upon substrates is an important manufacturing and research tool in a variety of fields. For example, microelectronic devices are prepared by depositing successive film layers onto a substrate to obtain specific electronic properties of the composite. Photosensitive devices such as vidicons and solar cells are manufactured by depositing films of photosensitive materials onto substrates. Optical properties of lenses are improved by depositing films onto their surfaces. These examples are, of course, only illustrative of the thousands of applications of thin film deposition techniques.

In the highly controlled approach to thin-film deposition that is characteristic of applications where a high quality film is required, the film is built up by successive deposition of monolayers of the film, each layer being one atom thick. The mechanics of the deposition process can best be considered in atomistic terms. Generally, in such a process the surface of the substrate must be carefully cleaned, since minor contaminant masses or even contaminant atoms can significantly impede the deposition of the required highly perfect film. The material of the film is then deposited by one of many techniques developed for various applications, such as vapor deposition, electron beam evaporation, sputtering, or chemical vapor depostion, to name a few.

In another technique for depositing thin films, ionized clusters of atoms are formed in a cluster source. These clusters usually have on the order of about 1000 atoms. The clusters are ionized and then accelerated toward the substrate target by an electrical potential that imparts an energy to the cluster equal to the accelerating voltage times the ionization level of the cluster. Upon reaching the surface of the substrate, the clusters disintegrate at impact. Each atom fragment remaining after disintegration has an energy equal to the total energy of the cluster divided by the number of atoms in the cluster. The cluster prior to disintegration therefore has a relatively high mass and energy, while each atom remaining after disintegration has a relatively low mass and energy. The energy of the atom deposited upon the surface gives it mobility on the surface, so that it can move to kinks or holes that might be present on the surface. The deposited atom comes to rest in the imperfections, thereby removing the imperfection and increasing the perfection and density of the film. Other approaches to using clusters have been developed, and it appears that deposition using cluster beams is a promising commercial film manufacturing technique.

Presently available cluster beam techniques still have significant drawbacks, however. There is some surface damage induced by the beam as the film grows. This type of damage produces just the type of defect that the cluster beam approach is intended to avoid, and does avoid in part for the reasons just stated.

Accordingly, there is a continuing need for an improvement to the cluster beam approach that avoids the damage induced in the substrate by the beam. The improvement must be compatible with the cluster beam approach, and with apparatus for cluster beam thin film fabrication and the systems to which the technique is applied. The present invention fulfills this need, and further provides related advantages.

SUMMARY OF THE INVENTION

The present invention is embodied in apparatus for producing a cluster beam with those beam portions likely to cause substrate damage removed. The apparatus utilizes several of the same components used in conventional apparatus for producing cluster beams, but is modified by the addition of one or two components which are readily incorporated into such systems. The improved apparatus can be used to produce both volatile and nonvolatile clusters, and is not limited as to the types of clusters to an extent greater than the unmodified apparatus. The added components permit precise control of the types of clusters that reach the target substrate, thereby avoiding the impact of clusters of excessively high energy onto the substrate.

In accordance with the invention, a process for selecting particles of a selected mass range from a cluster beam comprises the steps of ionizing the particles of the cluster beam; passing the ionized cluster beam through a mass separator, wherein particles of different masses are classified in a manner dependent upon their masses; and extracting the particles of the specified mass range from the mass separator.

In accordance with another aspect of the invention, apparatus for producing a beam of ionized clusters comprises a cluster source for producing a cluster beam, the cluster beam having therein unclustered atoms and loosely bound clusters of atoms of from about 2 to about 10,000 atoms; an ionizer which receives unclustered atoms and clusters from the cluster source and ionizes the unclustered atoms and clusters; and mass separator means for separating those clusters having a mass greater than a selected mass from the remainder of the cluster beam. The clusters which leave the separator means are then accelerated by an electrostatic accelerating means, which is typically a pair of apertured plates having an accelerating potential applied to the second plate. Thus, the cluster source produces particles of sizes ranging from monatomic to large clusters, and the mass separation means allows only those of a size greater than a selected value to reach a target substrate.

The key to understanding the approach of the present invention is found in an examination of the accelerated ions and clusters reaching the substrate, in the absence of the mass separator. The majority of the ions and clusters carry a single charge, imparted by the ionizer. The energy imparted to such an ion or cluster ion that is accelerated by an electrostatic accelerator is determined by the ionic charge, not the mass of the ion or cluster. Thus, a single ion of one atomic mass receives the same energy as a singly ionized cluster of 1000 atom masses. When the single ion strikes the surface of the substrate, it transfers to the substrate that entire energy. The energy is usually chosen to be a fairly high value—one to several thousand electron volts—to allow the desired clusters to penetrate to the surface of the substrate through any space charge above the surface of the substrate. The large energy transferred to the substrate by a single ion is highly localized, and can generate excessive defects such as vacancies in the surface, which are then possibly retained in the completed film as undesirable defects.

The large, singly ionized cluster has the same total energy, but the cluster disintegrates upon impacting the substrate. Each atom of the cluster then carries the total energy divided by the number of atoms in the cluster. For example, if the total energy is 2000 electron volts, a single ion striking the surface would transfer 2000 electron volts of energy in a single location. A cluster of 1000 atoms would disintegrate upon striking the surface, and the atoms disperse in the manner of a hot gas on the surface. The dispersed atoms each have an energy of only 2 electron volts, and this energy is transferred to the surface in a decentralized manner so that defects are not created. It will be appreciated that small clusters can have the same undesired effects as ions of single atoms. In the example under discussion, a singly ionized cluster of two atoms would disintegrate upon impacting the substrate surface, and each atom would carry 1000 electron volts of energy. This energy level also is high enough to cause damage to the substrate.

Unfortunately, there is known no type of cluster source producing only large clusters or a very narrow range of cluster sizes. Accepting the fact that the cluster beam upon production will contain at least some ionized atoms and small clusters in addition to the desired large clusters, the damage to the substrate can be avoided by removing the ionized atoms and smaller clusters from the beam. A mass separator is therefore required that separates the large clusters from the small clusters and unclustered ions.

Magnetic mass seperators could be used. A magnetic mass separator imposes a strong magnetic field upon the beam, and the deflection of each atom or cluster in the beam is related to its mass. The greater the mass of the particle passing through the magnetic field, the less its deflection. While feasible, such magnetic mass separators require large magnetic pole pieces and are not readily incorporated into conventional optical columns. Magnetic separators also have the disadvantage of separating all of the cluster masses from each other, and in most applications it is preferred only to separate the large clusters from the smaller clusters and unclustered atoms. Magnetic separators also decollimate the beam, and further lenses are required to recollimate the beam after the magnetic mass separation. If these difficulties can be overcome, then magnetic mass separation could be used in conjunction with the present invention.

Preferably, the mass separator is an electrostatic mass separator. The clusters and unclustered atoms produced by the cluster source have a generally uniform velocity, so that the kinetic energy of each particle is proportional to its mass. The preferred electrostatic mass separator produces a planar retarding field that reflects particles having kinetic energies below a value controllable by the value of the voltage applied to the mass separator. Since the velocities of the particles are comparable, the retarding field has the effect of separating particles of different masses. Clusters of higher mass pass through the electrostatic mass separator, while ionized unclustered atoms and small clusters are reflected. The electrostatic mass separator does not require a large space, and readily fits within conventional optical columns and vacuum apparatus. Moreover, the electrostatic mass separator does not decollimate the cluster beam that is passed therethrough, so that for many applications there is no need to provide a lens to recollimate the beam.

A preferred design for the electrostatic mass separator utilizes one or two gridded electrodes intercepting the cluster beam, so that the beam must pass therethrough. The term grid refers to a two-dimensional, repetitive pattern of two sets of parallel disposed grid conductors separated by spaces therebetween, in the manner of a screen used on windows. The first electrode, nearest the ionizer, is an entrance electrode which is electrically floated at the potential of the ionizer. The entrance electrode prevents the potential field of the second electrode from extending outwardly from the mass separator in a nonuniform fashion and decolimating the cluster beam as it passes through the ionizer. The second electrode, further from the ionizer, is a retarding field electrode to which a voltage potential is applied to reject the particles of less than a selected mass.

To best serve its intended function, the electrostatic mass separator is preferably operated in conjunction with a unipotential ionizer. A unipotential ionizer produces ionized clusters and unclustered atoms having substantially a single potential across the full extent of the cluster beam. Such a uniform potential permits the particles of differing masses to be separated effectively in the mass separator, since virtually all particles have the same velocity and potential upon entering the mass separator. Ionizers having a discharge plasma inherently operate in a unipotential fashion, and are preferred. The use of a unipotential ionizer and the entrance electrode in combination assure that all ionized clusters are retarded from the same potential level and by the same, uniform retarding field. Small clusters are uniformly rejected across the width of the cluster beam.

The voltage applied to the retarding field electrode is of the same sign as the ionization of the particles in the cluster beam. In the usual case, the particles are positively ionized, and the voltage applied to the retarding field electrode is positive. The exact value of the voltage applied depends upon the mass value selected as the dividing line. The greater the mass values to be rejected, the higher is the applied voltage. The applied voltage that is required in a particular system can also vary with the type of particles in the cluster beam, the design of the source and ionizer, and the exact configuration of the electrodes in the mass separator.

Since the cluster beam passes through the preferred gridded electrostatic mass separator, some of the particles in the beam will impact upon the solid grid conductor elements. Impacting upon the grid conductors of the entrance electrode is acceptable, since any charged small fragments produced by the impacts are retarded and rejected by the retarding field electrode. Impacting of clusters upon the retarding field electrode grid elements is less acceptable, however, and should be minimized. Such impacts can create charged forward scattered fragments of low mass that can find their way to the substrate. Generally, impacting of particles upon grid elements of the retarding field electrode can be minimized or even avoided entirely by carefully aligning the grid elements of the retarding field electrode with the corresponding grid elements of the entrance electrode. Any particle passing through the grid openings of the entrance electrode will therefore pass through the grid openings of the retarding field electrodes, unless repelled by the retarding field.

It will be appreciated that the mass separator of the present invention, when incorporated with conventional elements of a cluster beam apparatus, provides an important advance in the art of deposition by cluster beams. Particles of low mass are eliminated from the cluster beam and do not reach the target substrate, with the result that the damage to the substrate by energetic ions of low mass is avoided. The resulting thin films are more highly perfect, and are therefore more suitable for demanding applications such as in electronic devices. Other features and advantages of the invention will be apparent from the following more detailed description of the invention, taken in conjunction with the accompanying drawings, which illustrate, by way of example, the principles of the invention.

DETAILED DESCRIPTION OF THE PREFERRED EMBODIMENT

Figure 1:
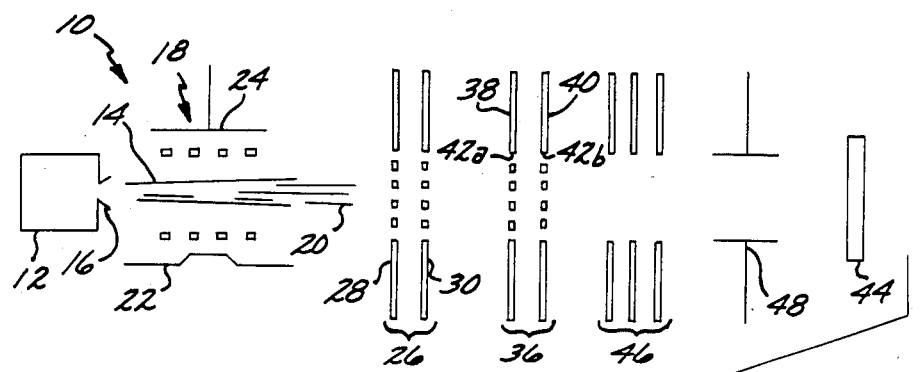
FIG. 1 is a schematic side view of an apparatus for producing a cluster beam.

The present invention is embodied in a deposition apparatus 10 illustrated in FIG. 1. The deposition apparatus 10 includes a cluster source 12 which produces a cluster beam 14. The cluster beam 14 includes clusters of loosely bound atoms and unclustered single atoms, collectively termed particles herein, with the distribution of atoms and clusters determined by the construction of the source and the type of atoms being used. The velocities of the clusters and atoms are generally uniform, because of the manner in which the source operates.

In one type of source, atoms are heated in a crucible and emitted from an opening in the top of the crucible. A fraction of the atoms naturally cluster together, but the clustering efficiency of this type of source is low. In another type of source 12 illustrated in FIG. 1, clusters are formed by passing a pressurized gas of volatile atoms to be clustered through a sonic or supersonic nozzle 16. Clusters are formed when the gas expands and cools. The velocity of the atoms and clusters is relatively uniform upon ejection from the nozzle 16.

The cluster beam 14 is not ionized when it emerges from the cluster source 12, but must be ionized so that it can be electrostatically accelerated toward the substrate target. The particles of the cluster beam are ionized in an ionizer 18 to form an ionized cluster beam 20. In most instances, it is preferred to ionize the particles positively, and the following description is directed to an ionizer 18 that produces positive ionization of the particles. Electrons are emitted from a cathode 22 toward an anode 24 having an applied positive potential. The path of the electrons is transverse to and intercepting the line of flight of the particles of the previously unionized cluster beam 14. Some of the electrons hit the particles, and the particles become positively charged. Preferably, the positive potential of the anode 24 is about 50 to about 100 volts and the ionizer current is about 10 to about 30 milliamps. Under these conditions of operation, many particles, whether atoms or clusters, become singly ionized. It is convenient to consider each cluster itself as being charged, and to continue to speak of atoms, rather than ions, as comprising the clusters. The low level of ionization for each cluster is required so that the cluster may be controllably accelerated by an electrostatic accelerator.

The ionized cluster beam 20 contains ionized unclustered atoms, ionized clusters, and unionized atoms and clusters. The presence of the unionized atoms and clusters is of little consequence, since these particles are not electrostatically accelerated and never become energetic. It is, however, important to separate the unclustered ionized atoms and small ionized clusters from the larger ionized clusters for the reasons stated earlier.

A mass separator 26 reflects and rejects ionized atoms and ionized clusters of small size. In the preferred embodiment illustrated in FIG. 1, the mass separator 26 comprises two electrodes placed in the path of the ionized cluster beam 20. An entrance electrode 28 is positioned nearest to the ionizer 18, while a retarding field electrode 30 is placed further from the ionizer. The design of the entrance electrode 28 is dictated in part by the design of the retarding field electrode 30.

Figure 2:
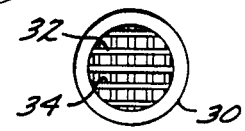
FIG. 2 is a front elevational view of a retarding field electrode used in the apparatus of FIG. 1.

The retarding field electrode 30 electrostatically produces a retarding field when a voltage equal in sign to the ionization of the particles is applied to the electrode 30. This retarding field should be as uniform as possible, since nonuniformities permit particles of different masses to pass and also tend to decollimate the ionized cluster beam 20. The retarding field electrode 30 should also permit a large fraction of the ionized cluster beam 20 to pass therethrough. These potentially conflicting design requirements lead to a preferred retarding field electrode 30 wherein the electrode is in the form of a two-dimensional grid of conducting elements 32, which have open, generally square apertures 34 therebetween. As illustrated in FIG. 2, the configuration of the electrode 30 is somewhat like that of fishnet or window screening. The retarding field is substantially the same for each aperture 34, although there is some minor variation across the dimension of the aperture.

The retarding field potential produced by the retarding field electrode 30 acts to retard all ions of the ionized cluster beam 20 having the same sign as the voltage applied to the electrode 30. Whether the retardation force is sufficient to prevent a particular particle from passing through the electrode 30 is determined by the kinetic energy of the particle and its degree of ionization. Singly ionized particles are retarded less strongly than are multiply ionized particles, and therefore even large multiply ionized particles are strongly retarded. Ionized particles of low mass, whatever their degree of ionization, are strongly retarded. The result is that all ionized but unclustered atoms are retarded strongly under the field of the retarding field electrode 30, and are repelled from the electrode 30 back toward the cluster source 12. Singly ionized clusters having a mass less than a selected value determined by the applied voltage are retarded strongly and repelled back toward the cluster source 12. Multiply ionized clusters having a mass even larger than the selected mass are retarded strongly and repelled back toward the cluster source 12. As stated earlier, unionized atoms and clusters are not affected by the retarding field. However, the energies of these unionized particles are low when emitted from the cluster source 12, and the unionized particles are not accelerated by a subsequent electrostatic accelerator. Thus, the result of the application of a sufficiently large retarding field is that substantially no ionized particles having a mass less than that of the selected mass can pass through to the target substrate.

The entrance electrode 28 is also preferably of a grid configuration having grid conducting elements of the same size and spacing as the grid conducting elements 32 of the retarding field electrode 30. It is important that particles in the ionized cluster beam 20 do not strike the grid conductor elements of the retarding field electrode 30. Such impacts may disintegrate the particles into smaller fragments having a size less than the desired minimum mass, and these fragments may find their way through the apertures 34 to the target. To minimize the possibility that particles can strike the grid conductor elements 32, the grid elements and apertures of the entrance electrode 28 are made identical to those of the retarding field electrode 30. Since the ionized cluster beam 20 is reasonably well collimated, any particle passing through the apertures of the entrance electrode 28 is likely to pass through the corresponding aperture of the retarding field electrode 30, without impacting the retarding field grid conducting elements 32, unless it is repelled by the retarding field.

The properly sized clusters having masses greater than the selected value preferably pass to an accelerator 36. In the accelerator 36, a first apertured electrode 38 is maintained at a potential less negative (for positively ionized clusters) than a second apertured electrode 40. The ionized cluster beam 20 passes through apertures 42a and 42b of the electrodes 38 and 40, respectively, and the particles are accelerated by the potential difference. The second apertured electrode 40 is typically about 1000 to about 10,000 volts more negative than the first apertured electrode 38, which is permitted to float at the same voltage as the ionizer 18. When a singly charged cluster of 1000 atoms passes through the electrodes 38 and 40 maintained at a voltage difference of 2000 volts, an energy of 2000 electron volts is imparted to the particles. This high energy and the high mass of the cluster permit the cluster to penetrate to the surface of a target substrate 44, even though an undesirable space charge may be present. Upon impact the cluster disintegrates, leaving each atom of the disintegrated cluster with the comparatively small energy of about 2 electron volts. The small energy per atom does not permit the atoms to penetrate the surface of the substrate 44 or otherwise damage the surface and the growing thin film. On the other hand, energies per atom on the order of about 1–10 electron volts aid in development of a uniform structure of the film.

The ionized cluster beam 20 is generally well collimated and can pass directly to the substrate 44. Alternatively, since the clusters of the beam 20 are ionized, they can be focused and deflected by the electrostatic or magnetic techniques used to control the flight of other types of charged particles. An electrostatic lens 46 is used to focus or defocus the cluster beam 20. Deflection plates 48 deflect the cluster beam 20 toward particular regions of the substrate 44. By these techniques, the ionized clusters can be directed toward a specific area of the substrate 44, as when the specific area requires a higher density of clusters during the fabrication of a particular electronic device structure.

Figure 3:
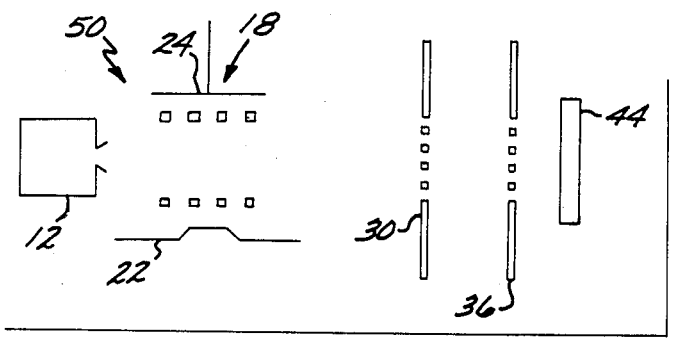
FIG. 3 is a schematic side view of another embodiment of an apparatus for producing a cluster beam, having no entrance electrode in the mass separator and a single accelerator electrode.

Another embodiment of deposition apparatus 50 is illustrated in FIG. 3. In the apparatus 50, the structure is generally similar except that there is no separate entrance electrode 28 for the mass separator 26. The ionizer 18 of FIG. 3 is a plasma-state ionizer for nonvolatile clusters, and the plasma boundary performs the functions of the entrance electrode 28.

Figure 4:
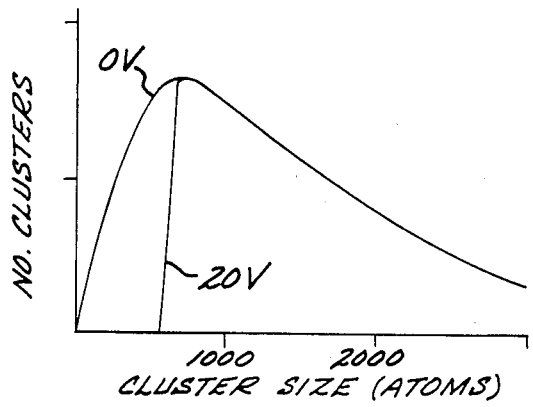
FIG. 4 is a graph of number of clusters reaching a substrate as a function of cluster size, both without (0 V) and with (20 V) electrostatic mass separation in operation.

The mass distribution of the particles passing through the apparatus 50 was measured with a biased Faraday cup that receives the ionized clusters beam 20 after it passes through the mass separator 26. FIG. 4 depicts the number of clusters reaching the measuring device as a function of cluster size, for a first case wherein no voltage V is applied to the retarding field electrode 30, and a second case wherein a voltage V of +20 volts is applied to the retarding field electrode 30. Application of the positive retarding field voltage V rejects the ionized particles having sizes below about 700–800 atoms. Increasing the voltage V increases the cluster size below which all unclustered ions and smaller clusters are rejected.

Figure 5:
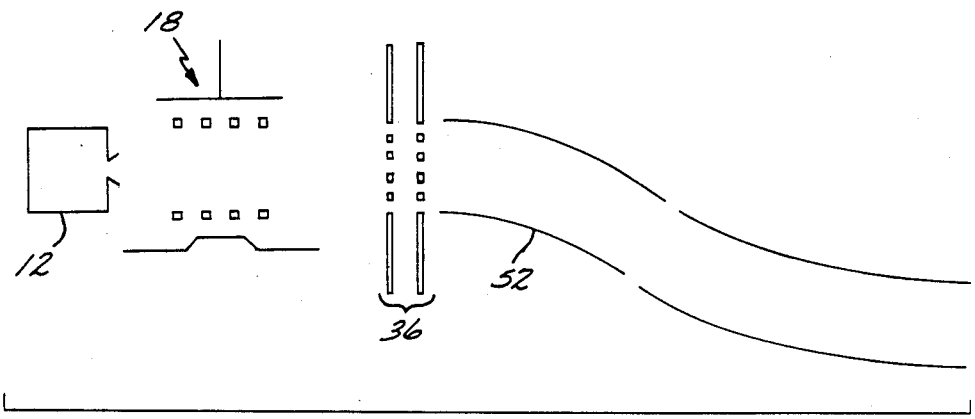
FIG. 5 is a schematic side view of an apparatus for producing a cluster beam, with a transverse electrostatic field.

As illustrated in FIG. 5, a transverse electrostatic mass separator 52 can also be used, but is less effective than the retarding mass separator 26 illustrated in FIGS. 1, 2, and 3. The transverse mass separator 52 deflects the lighter ionized particles into the wall, while the heavier particles are permitted to pass through. The transverse mass separator 52 has the disadvantage that the ionized cluster beam 20 is somewhat decollimated by the transverse electrostatic field. The flux of particles of a mass greater than the selected value is reduced as compared with the retarding mass separator 26, another disadvantage. Thus, the retarding field mass separator 26 is preferred to the transverse field mass separator 52, but the latter is operable and may find use in particular circumstances.

Figure 6:
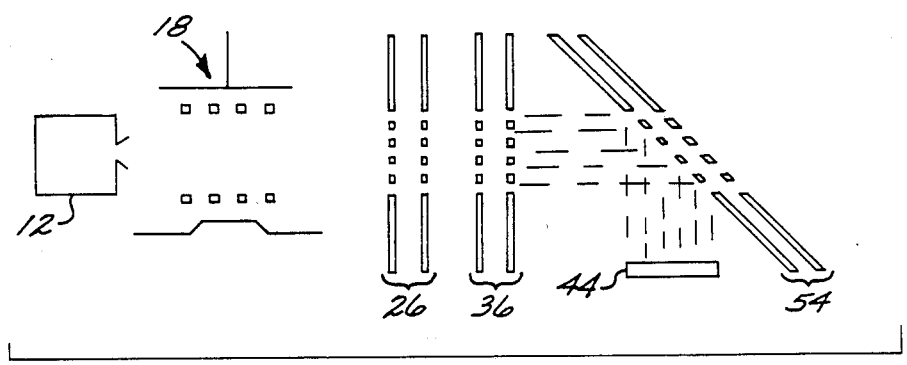
FIG. 6 is a schematic side view of an apparatus for producing a cluster beam, using two mass separators.

As illustrated in FIG. 6, a second mass separator 54 can be placed in the path of the ionized cluster beam 20, so that the beam passes through it after passing through the first mass separator 26. If the second mass separator 54 is set with a higher voltage applied to its retarding field electrode 30, then it will pass only ionized clusters of a mass greater than that passed by the first mass separator 26. The ionized clusters having masses in the range that is passed by the first mass separator 26 but is rejected by the second mass separator 54 may be captured and utilized, as by directing them against the substrate 44. The ionized particles so captured would have a range of masses that can be made arbitrarily small by reducing the retarding field of the second mass separator 54 arbitrarily close to that of the first mass separator 26. By this technique, ionized clusters having a narrow range of masses can be isolated and produced for use as needed.

The addition of the mass separator of the invention to apparatus for producing cluster beams circumvents one of the greatest disadvantages of existing apparatus for producing cluster beams. The present cluster producing machines permit unclustered ions and small ionized clusters to impact upon the substrate target, creating undesirable defects in the film being deposited. The present improvemnt removes the unclustered ions and small clusters from the ionized cluster beam, resulting in a more perfect structure of the final film.

Although a particular embodiment of the invention has been described in detail for purposes of illustration, various modifications may be made without departing from the spirit and scope of the invention. Accordingly, the invention is not to be limited except as by the appended claims.

What is claimed is:

1. A process for selecting particles of a selected mass range from a cluster beam, comprising the steps of:
   ionizing the particles of the cluster beam to produce an ionized cluster beam;
   passing the ionized cluster beam through an electrostatic mass separator, the electrostatic mass separator including means for producing an electrostatic field that permits those particles having masses within the selected mass range to pass therethrough but repels particles having lesser masses, and
   extracting the particles of the selected mass range from the electrostatic mass separator.

2. The process of claim 1, wherein said step of ionizing utilizes a unipotential ionizer wherein all particles are ionized to the same potential level.

3. The process of claim 1, wherein the mass separator produces an angularly deflecting electrostatic field which deflects the motion of the particles in accordance with their masses.

4. Apparatus for producing a beam of ionized clusters, comprising:
   cluster source means for producing a cluster beam, the cluster beam having therein unclustered atoms and loosely bound clusters of atoms of from about 2 to about 10,000 atoms;
   ionizer means for receiving unclustered atoms and clusters from said cluster source means and for ionizing the unclustered atoms and clusters to produce an ionized beam; and
   first mass separator means for receiving the ionized beam, passing those clusters having a mass greater than a selected mass, and not passing the remainder of the cluster beam, said first mass separator means including means for creating an electrostatic field that retards the motion of ionized atoms and clusters in the ionized beam.

5. The apparatus of claim 4, wherein said ionizer means includes unipotential ionizer means for ionizing atoms and clusters at a single potential level.

6. The apparatus of claim 4, wherein said mass separator means includes a retarding field electrode.

7. The apparatus of claim 4, wherein said mass separator means includes an electrode in the form of a grid.

8. The apparatus of claim 4, wherein said mass separator means includes an entrance electrode and a retarding field electrode.

9. The apparatus of claim 8, wherein each of said electrodes is in the form of a grid placed in the path of the cluster beam, the openings of the two grids being aligned.

10. The apparatus of claim 4, further including accelerating means for accelerating said ionized cluster beam.

11. The apparatus of claim 10, wherein said accelerating means is positioned to receive the ionized cluster beam after it passes through said mass separator means.

12. The apparatus of claim 4, further including
   second mass separator means for reflecting those clusters having a mass less than a second selected mass to pass into a target, said second mass separator means being positioned to receive the portion of the ionized cluster beam having masses greater than the selected mass, after it passes through said first mass separator means, so that said first mass separator means and said second mass separator means used in cooperation permit the selection of clusters of a narrow range of masses.

13. Apparatus for producing a beam of ionized clusters having masses greater than a selected mass, comprising:
   a cluster source that produces a cluster beam having therein unclustered atoms and loosely bound clusters of atoms of from 2 to about 10,000 atoms;
   an ionizer disposed so as to receive the cluster beam from said cluster source, said ionizer producing a beam of ionized atoms and clusters; and
   a first electrostatic mass separator disposed to receive the beam of ionized atoms and clusters from said ionizer, said first mass separator including a retarding field electrode in the form of a grid intercepting the beam of ionized atoms and clusters, so that, upon application of a sufficiently great electrical potential of the same sign as that of the ionization of the ionized cluster beam to said retarding field electrode, clusters of a mass greater than the selected mass pass through the grid to form a beam of ionized clusters having masses greater than the selected mass, and clusters of a mass less than the selected mass do not pass through the grid.

14. The apparatus of claim 13, wherein said mass separator further includes an entrance electrode in the form of a grid intercepting the cluster beam, the openings of the entrance electrode grid and the retarding field electrode grid being aligned.

15. The apparatus of claim 13, further including an accelerating means for accelerating the ionized cluster beam.

16. The apparatus of claim 13, wherein said accelerating means is positioned to receive the ionized cluster beam after it passes through said mass separator.

17. The apparatus of claim 13, further including a second electrostatic mass separator positioned to intercept the ionized cluster beam after it passes through said first electrostatic mass separator so as to generate a cluster beam with a narrow mass distribution.

18. The apparatus of claim 13, further including lens means for focusing the cluster beam, said lens means being positioned after said ionizer.

19. The apparatus of claim 13, further including deflection means for deflecting the cluster beam, said deflection means being positioned after said ionizer.

* * * * *